United States Patent
van Sinderen et al.

(10) Patent No.: US 9,276,535 B2
(45) Date of Patent: Mar. 1, 2016

(54) TRANSCONDUCTANCE AMPLIFIER

(71) Applicant: NXP B.V., Eindhoven (NL)

(72) Inventors: Jan van Sinderen, Liempde (NL);
Johannes Brekelmans, Niederweert (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/278,227

(22) Filed: May 15, 2014

(65) Prior Publication Data
US 2014/0340151 A1    Nov. 20, 2014

(30) Foreign Application Priority Data

May 17, 2013  (EP) ..................................... 13168324

(51) Int. Cl.
*H03F 3/193* (2006.01)
*H03F 1/34* (2006.01)
*H03F 3/45* (2006.01)

(52) U.S. Cl.
CPC ................ *H03F 3/193* (2013.01); *H03F 1/342* (2013.01); *H03F 3/45475* (2013.01); *H03F 2200/294* (2013.01); *H03F 2200/453* (2013.01); *H03F 2200/456* (2013.01); *H03F 2203/45288* (2013.01)

(58) Field of Classification Search
USPC ........................................ 330/260, 262–265
See application file for complete search history.

(56) References Cited

U.S. PATENT DOCUMENTS

| 6,121,818 | A | 9/2000 | Kim et al. |
| 7,656,229 | B2* | 2/2010 | Deng et al. .................... 330/149 |
| 2008/0001661 | A1 | 1/2008 | Tachibana et al. |
| 2009/0251217 | A1 | 10/2009 | Keerti |
| 2011/0316632 | A1 | 12/2011 | Takemoto et al. |
| 2012/0068770 | A1* | 3/2012 | Cellier et al. ................. 330/260 |

FOREIGN PATENT DOCUMENTS

| EP | 0 390 226 A1 | 10/1990 |
| EP | 2 200 176 A1 | 6/2010 |
| WO | 2007/034403 A1 | 3/2007 |

OTHER PUBLICATIONS

Chen, X., et al; "A CMOS Differential Noise Cancelling Low Noise Transconductance Amplifier"; Circuits and Systems Workshop : System-on Chip-Design, Application, Integration and Software; Dallas, TX, US; pp. 1-4 (Oct. 2008).

Duong, Quoc-Tai, et al; "Low Noise Transconductance Amplifier Design for Continuous-Time sigma-delta Wideband Frontend" ; 2011 20th European Conference on Circuit and Theory Design; pp. 825-828 (2011).

(Continued)

*Primary Examiner* — Hieu Nguyen

(57) ABSTRACT

A transconductance amplifier comprises a set of amplifier stages. The last stage of the amplifier is split with a certain ratio whereby one part is used to deliver output current and other part to deliver feedback current to the input.

13 Claims, 10 Drawing Sheets

(56) References Cited

OTHER PUBLICATIONS

Keehr, E.A., et al; "A Wide-Swing Low-Noise Transconductance Amplifier and the Enabling of Large-Signal Handling Direct-Conversion Receivers"; Circuits and Systems I: Regular Papers, IEEE Transactions on, vol. 59, Issue 1; pp. 30-43 (Jan. 2012).

Qazi, F., et al; "Wideband RF Frontend Design for Flexible Radio Receiver"; 13th Int'l Symposium on Integrated Circuits; pp. 220-223 (2011).

Ru, Zhiyu, et al; "Digitally Enhanced Software-Defined Radio Receiver Robust to Out-of-Band Interference"; IEEE Journal of Solid-State Circuits, vol. 44, No. 12; pp. 3359-3375 (Dec. 2009).

Xu, Jiangtao, et al; "Noise analysis of the CG-CS low noise transconductance amplifier"; 2011 International Conference of Electron Devices and Solid-State Circuits; pp. 1-2 (2011).

Lee, Sang-Soo, et al; "A 40 MHz CMOS Continuous-Time Current-Mode Filter"; IEEE Custom Integrated Circuits Conference; IEEE, Piscataway, NJ, US; 4 pages (May 3, 1992).

Extended European Search Report for application No. 13168324.5 (Oct. 11, 2013).

* cited by examiner

TRANSCONDUCTANCE AMPLIFIER

This invention relates to transconductance amplifiers. In particular, it relates to a transconductance amplifier that can be integrated into CMOS.

The semiconductor industry is rapidly converging on mainstream CMOS. Economy of scale, high gate density and high switching speed make CMOS the ideal process for high-complexity low-cost products.

Demand for more features and functions at lower cost has resulted in a trend towards configurable receiver architectures in CMOS that exploit an increasing degree of digital signal processing. The increasing switching speeds give higher bandwidth, and with digitization earlier in the signal chain easing configurability is possible allowing for digital compensation & correction of analogue deficiencies.

Wide-band receiver architectures are challenging with respect to the required analogue circuit performance. The supply voltage of CMOS is decreasing with each next technology node, and this increases the difficulty of implementation.

Wide-band digitization is usually implemented after a first frequency down-conversion of the original RF signal to Zero-IF or Low-IF using a mixer stage.

FIG. 1 shows a down converter using a low noise amplifier ("LNA") the output of which is provided to a passive mixer, represented by switch 10, driven by a local oscillator signal ("LO").

One or more low noise amplifiers may be used to obtain a low overall noise figure. The LNA output voltage is converted to a mixer input current with a series resistor Rs. A transimpedance amplifier ("TIA") is shown at the mixer output for conversion from current to voltage.

The LNA input carries both wanted and unwanted signals. Depending on receive conditions, the unwanted signals may be very large compared to the wanted signal. The maximum signal swing together with its noise level determines the Dynamic Range (DR) of the down converter. The maximum signal swing is constrained by the voltage headroom of the RF stage given by the supply voltage vdd-vss.

To overcome this constraint the LNA with voltage amplification can be replaced by a Low Noise Transconductance Amplifier ("LNTA") with current amplification, as shown in FIG. 2.

The LNTA amplifies the RF signal in the current domain and directly delivers a signal current into the mixer, so that the resistor (which implements voltage to current conversion) is not needed. Voltage to current conversion is moved inside the LNTA where it can be implemented at a lower impedance level reducing the limitation imposed by supply voltage headroom. As illustrated in FIG. 2, the LNTA takes care of the V-I conversion, signal amplification and input impedance matching. To prevent RF domain voltage amplification (and loss of DR) a low impedance at node B maintained over a wide frequency band is important. This is realized by using low-ohmic switches in the passive mixers in combination with a transimpedance amplifier (TIA) with a low input impedance maintained over a wide frequency band.

The TIA is an operational amplifier with a feedback network consisting of a parallel resistor and capacitor network, which form a low pass filter. The low pass filter characteristic means that only RF signals near the LO frequency will develop an intermediate frequency ("IF") signal swing at the output while signals farther away will be attenuated.

The output signal of LNTA being a current instead of a voltage makes it more difficult to apply integral negative feedback across the LNTA to enhance its noise and linearity and to obtain correct input impedance.

The invention is defined by the claims.

According to the invention, there is provided a transconductance amplifier, comprising:
   an input amplifier stage;
   an output amplifier stage; and
   a replica output stage which generates a feedback current which is a scaled replica of the output current of the amplifier, wherein the feedback current is provided to the amplifier input.

The invention proposes a realization for the LNTA that provides a simple implementation of a negative feedback system for input termination. The required input and output impedance can be obtained while achieving low noise and high intermodulation performance. When used as part of a down converter this results in better overall performance than realizable with a traditional voltage domain LNA based mixer stage.

The feedback can be denoted as "replica feedback" and enables a high linearity and a low noise at the native supply voltage of the technology used, such as CMOS technology. The replica feedback also allows for multiple weighted current outputs. If needed, low noise gain reduction can be accomplished by switching the ratio of transconductance elements in the output and feedback stage.

The amplifier is fully realisable using CMOS technology. Each amplifier stage is preferably implemented as a complementary amplifier comprising a PMOS transistor and an NMOS transistor.

The feedback current can be provided to the amplifier input through a feedback impedance (such as a resistor). The feedback impedance can be used to provide voltage matching between the feedback and output terminal (fb and Vout respectively) to ensure minimal distortion.

The input amplifier stage can comprise a series circuit of a first inverter and a second inverter (i.e. the output of one feeds the input of the next), the second inverter providing a drive signal (Vg) to the amplifier output stage and a scaled replica output stage that operates in parallel. A first resistor and second resistor are used to convert input voltage to output current. These feedback resistors set the gain of the amplifier. The DC bias current of, amongst others, output stage and the replica output stage may also flow through the feedback resistors.

A variable resistor can be provided between an input of the amplifier and the input of the first inverter stage. This can be used for input impedance matching, for example when gain adjustment is provided.

The output stage can comprise a plurality of sections in parallel, providing a set of weighted outputs.

The invention also provides a frequency down converter comprising:
   an amplifier of the invention;
   a frequency conversion stage driven with signal current by the amplifier; and
   a transimpedance amplifier connected to the output of the frequency conversion stage.

Examples of the invention will now be described in detail with reference to the accompanying drawings, in which:
   FIG. 1 shows a known frequency downmixing circuit based on a low noise amplifier (LNA);
   FIG. 2 shows a known frequency downmixing circuit based on a low noise transconductance amplifier (LNTA);
   FIG. 3 shows a textbook implementation of an LNTA without input termination;

The invention provides a transconductance amplifier, comprising a set of amplifier stages. The last stage of the amplifier is split into multiple sections having a certain ratio whereby one or more sections are used to deliver one or more output currents and one section is used to deliver feedback current to the input.

Figure 1:
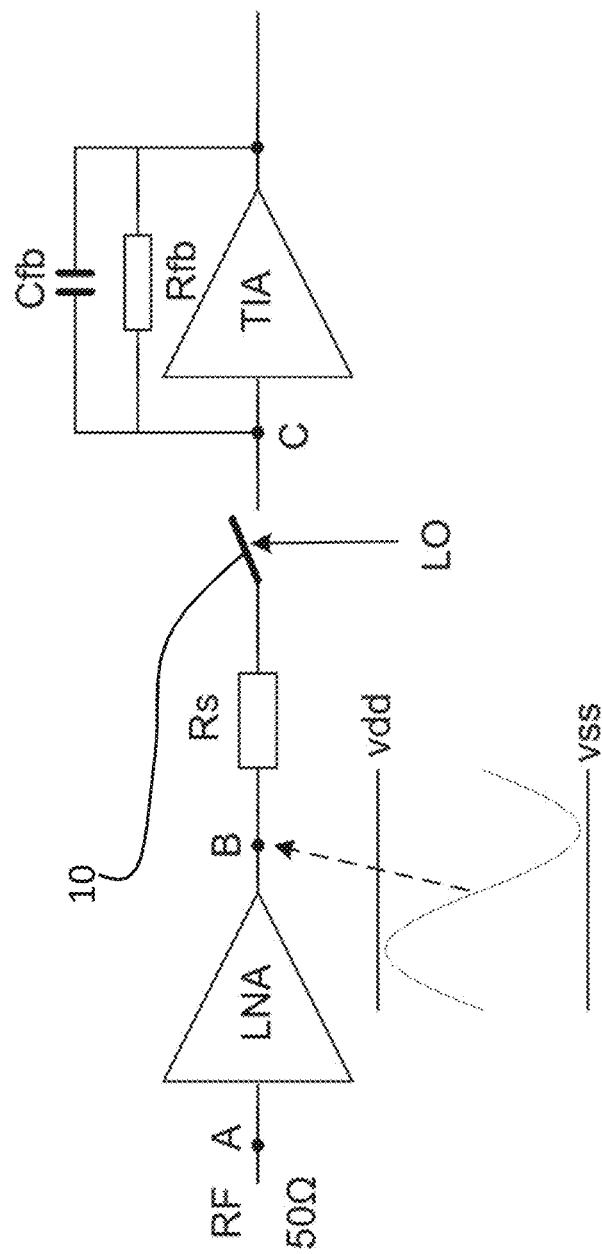
Figure 2:
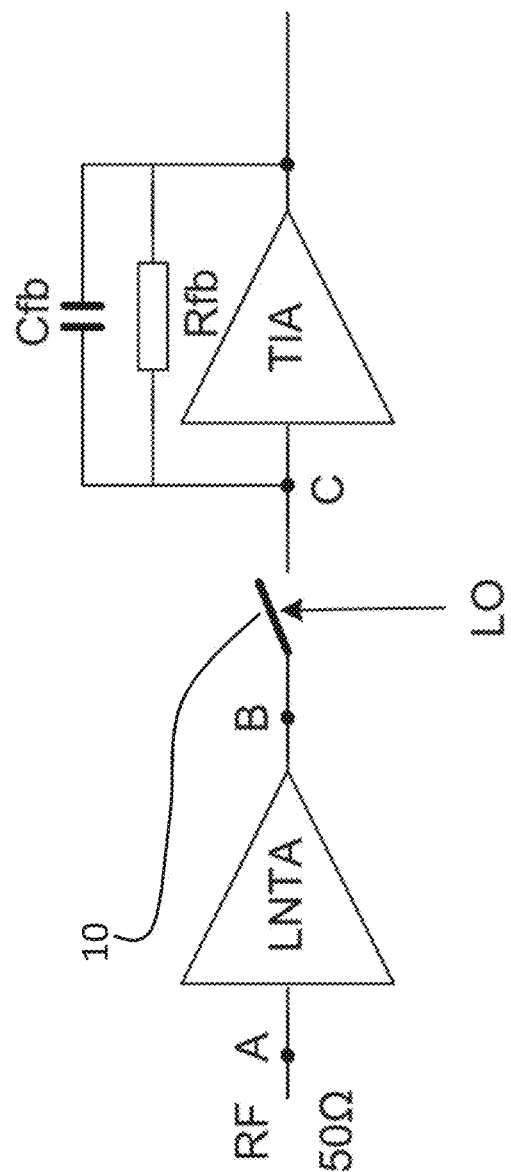
Figure 3:
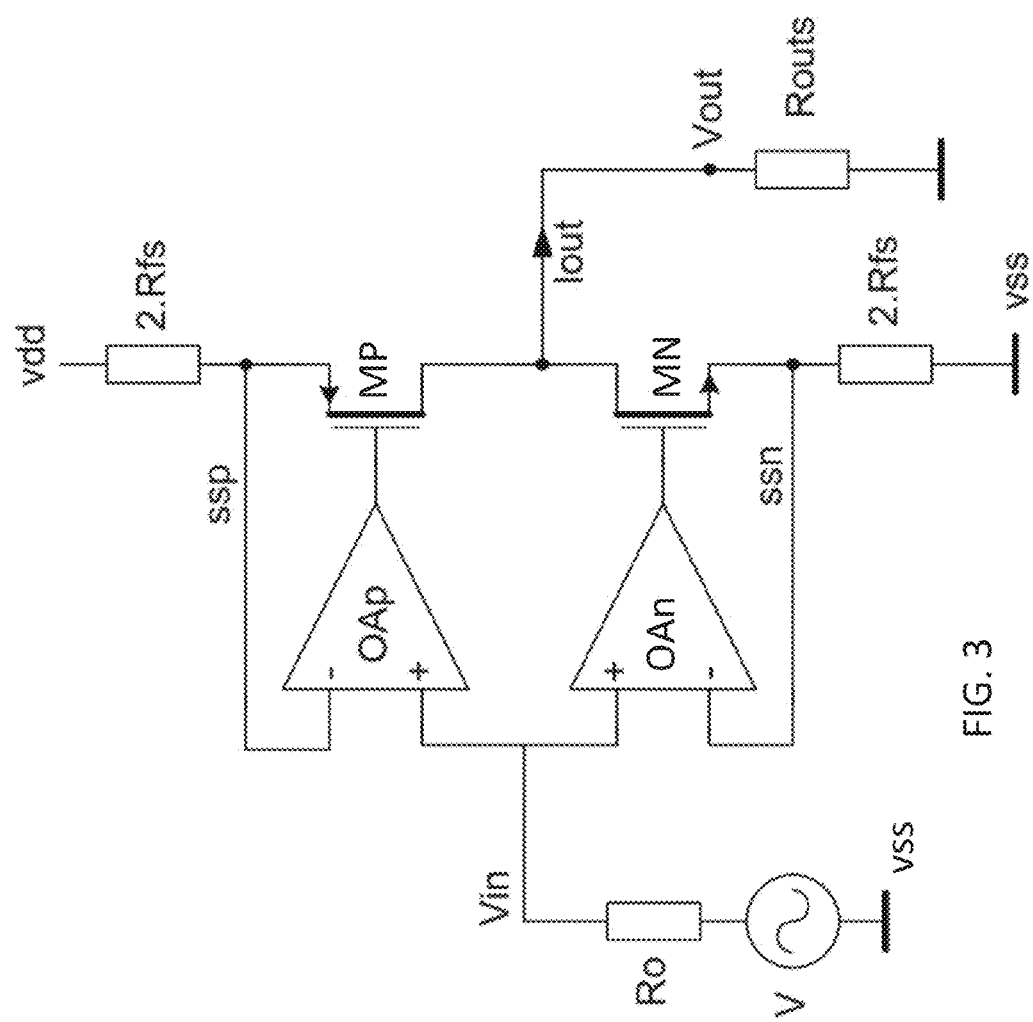

FIG. 3 shows a simplified drawing of a low noise transconductance amplifier without provision for input termination.

The circuit has an output stage comprising a PMOS transistor MP and an NMOS transistor MN connected in series between power rails vdd, vss through 2 feedback resistors 2.Rfs. The joined drain terminals of MP and MN form the output node. Each transistor has its gate controlled by a respective opamp OAp, OAn. There is a negative feedback path from the source of each transistor to the inverting terminal of the respective opamp. The input voltage connects to the non-inverting input terminals of the two opamps. This input voltage is represented by an alternating voltage V and a source resistance Ro.

Equal resistors 2Rfs are connected between the power rails and the transistor sources. These function as feedback resistors which set the voltage-to-current gain of the transconductance amplifier.

The operation of the circuit can be understood by considering the small signal equivalents in the following way. The input voltage Vin is copied to the MOS transistor source terminals ssp and ssn respectively, using a large amount of negative feedback delivered by the two opamps. The output current Iout is the sum of the currents flowing through the two feedback resistors 2.Rfs and is determined by input voltage Vin divided by each of the resistors 2.Rfs. Assuming operational amplifiers OAp and OAn are both ideal, the node voltage Vin is copied to the MOS transistor sources ssp and ssn so that the output current Iout delivered to the output load resistance Routs will equal:

$$Iout = \frac{ssp}{2.Rfs} + \frac{ssn}{2.Rfs} \approx \frac{Vin}{Rfs}$$

The circuit of FIG. 3 has no input termination. In accordance with the invention, by feeding back into the input a defined fraction of the output current, the correct input termination can be obtained. In addition, the linearity of the amplifier is enhanced by this added negative feedback.

At very high frequencies a fraction of the output current could be split from the output with a transformer. For operation at relatively low frequencies a transformer becomes too big.

Figure 4:
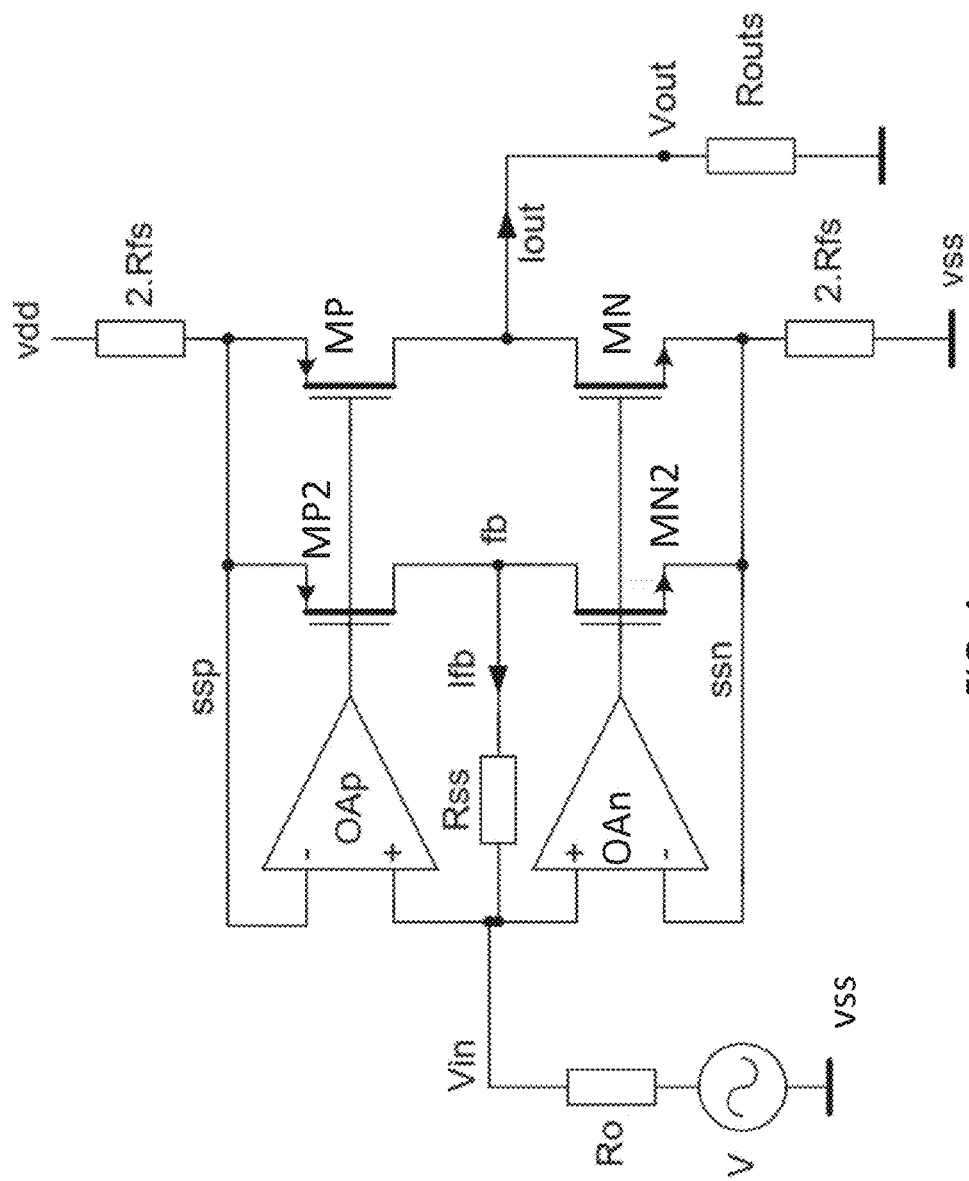
FIG. 4 shows a an implementation of LNTA using replica feedback to obtain input termination, in accordance with the invention.

The invention provides the solution as shown in its most basic form in FIG. 4. FIG. 4 shows the circuit of FIG. 3 with added current feedback for input termination.

In FIG. 4, a fraction of the output current is used for the input termination. The fraction is obtained using a transistor pair MP2 and MN2 representing scaled replicas of MP and MN respectively. A feedback current Ifb is generated, and it is supplied to the input through a series resistor Rss. Note that the resistor Rss is not essential, and when used it is to provide more accurate voltage matching between the terminal fb and Vout respectively to ensure minimal distortion.

The termination may halve the voltage swing Vin, and in this way it can account for 6 dB additional negative feedback.

Figure 5A:
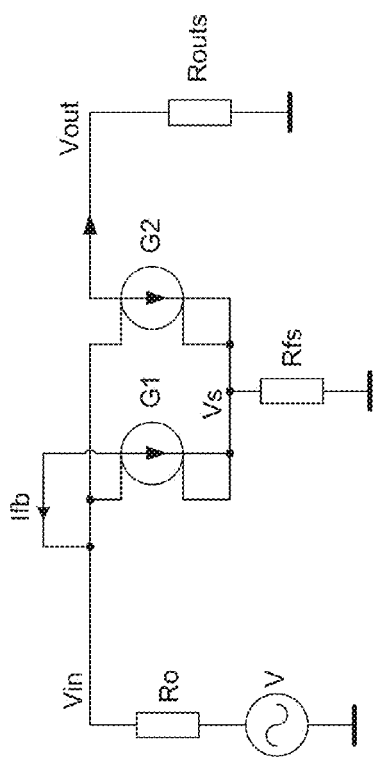
FIGS. 5A and 5B show simplified equivalent circuits for the circuit of FIG. 4.
Figure 5B:
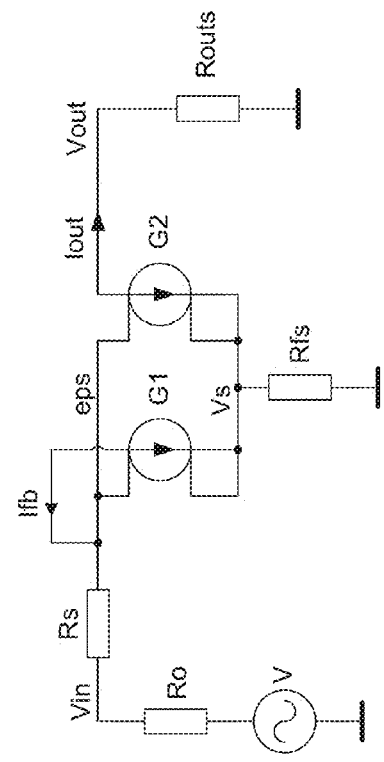

FIG. 5(a) shows a simplified circuit corresponding to FIG. 4 to allow for more analytical description of circuit operation. It comprises two voltage-controlled current sources with gain factors G1 and G2. FIG. 5(b) corresponds to FIG. 5(a) but additionally shows an input impedance Rs which can be used to maintain a constant input impedance if a gain reduction function is implemented.

Solving the equations for currents and voltages assuming a matched input condition (Vin=V/2) leads to:

$$gm = \frac{|Iout|}{\left|\frac{V}{2}\right|} = \frac{(Rfs - Ro + Rs)}{Ro\left(Rfs + \frac{1}{G2}\right)}$$

$$\frac{G1}{G2} = \frac{|Ifb|}{|Iout|} = \frac{-(G2 \cdot Rfs + 1)}{G2(Rfs - Ro + Rs)}$$

Best noise performance is obtained when resistance Rs=0 (i.e. the circuit of FIG. 4 and its equivalent circuit in FIG. 5(a)) but a non-zero value may be needed for correct input matching when gain reduction is applied by changing the ratio of G1 to G2. In a practical implementation, the ratio of G1 to G2 translates to the ratio of widths of transistors used for the replica and output stage.

If Rs = 0:

$$gm = \frac{|Iout|}{\left|\frac{V}{2}\right|} = \frac{(Rfs - Ro)}{Ro\left(Rfs + \frac{1}{G2}\right)}$$

$$\frac{G1}{G2} = \frac{|Ifb|}{|Iout|} = \frac{-(G2 \cdot Rfs + 1)}{G2(Rfs - Ro)}$$

Compared to gain reduction effected with a passive input attenuator, the gain reduction effected through negative feedback delivers a more favourable Noise Figure.

The table below illustrates some circuit parameter values required to obtain different gain settings when the value of the series-feedback resistor Rfs is kept constant. Note that the resistors 2.Rfs are feedback resistors, and they can be used to control the gain since they directly influence the current flow to the output. However, there are practical reasons for maintaining Rfs constant and implementing gain control by other parameters, as shown in the table below. Practical parameter values are given for different values of transconductance gm.

| | G2 = 2 A/V, Ro = 100 Ω | | | | | | | |
|---|---|---|---|---|---|---|---|---|
| Gm dB | gm mS | Rfs Ω | Rs Ω | NF dB | S (gm, G2) % | G2/G1 x | dNF dB | Atten dB |
| 0 | 35.000 | 21.83 | 0.00 | 0.858 | 2.24% | 3.500 | 0.000 | 0 |
| −2 | 27.801 | 21.83 | 16.09 | 1.396 | 2.24% | 2.780 | 0.539 | 2 |
| −4 | 22.084 | 21.83 | 28.86 | 1.781 | 2.24% | 2.208 | 0.923 | 4 |
| −6 | 17.542 | 21.83 | 39.00 | 2.064 | 2.24% | 1.754 | 1.206 | 6 |
| −8 | 13.934 | 21.83 | 47.06 | 2.276 | 2.24% | 1.393 | 1.418 | 8 |
| −10 | 11.068 | 21.83 | 53.46 | 2.438 | 2.24% | 1.107 | 1.580 | 10 |
| −12 | 8.792 | 21.83 | 58.54 | 2.562 | 2.24% | 0.879 | 1.704 | 12 |

Figure 6:
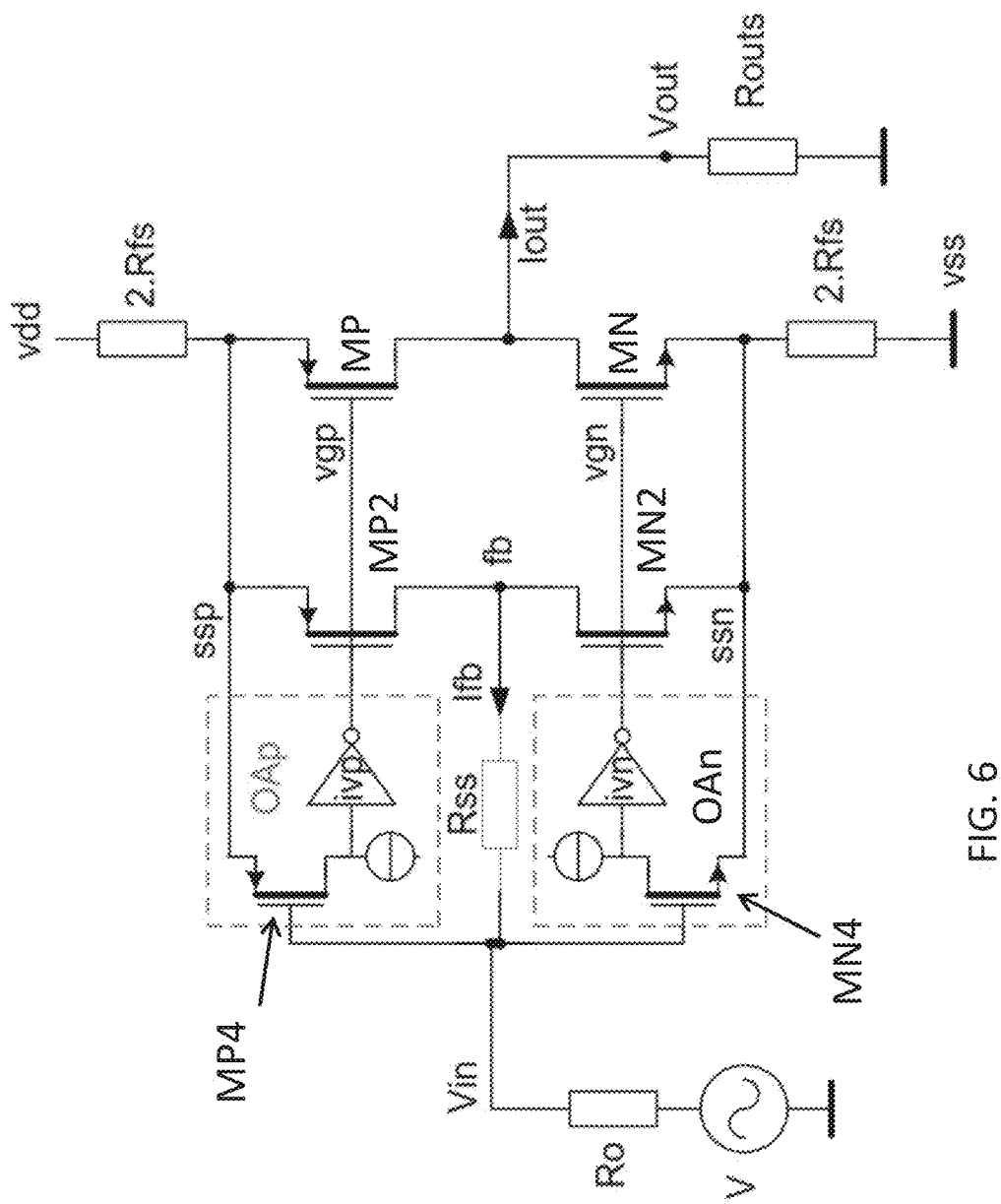
FIG. 6 shows the circuit of FIG. 4 extended with a possible implementation for the operational amplifiers.

FIG. 6 shows the circuit of FIG. 4 with each opamp implemented by a single transistor with a current source followed by an inverter.

The input voltage is thus copied to the source terminals ssn and ssp respectively with a threshold voltage drop determined by transistors MN4, MP4 respectively.

FIG. 6 thus provides a simple implementation of the circuit of FIG. 4.

Since in FIG. 6 the signals ssp and ssn are approximately identical (and approximately equal to Vin, considering again the small signal equivalents), also the drive signals vgp and vgn at the output stage MP,MN are nearly identical and can be combined into single drive signal Vg.

Likewise the driver stages can be merged. The combination then results in the full circuit shown in FIG. 7.

Figure 7:
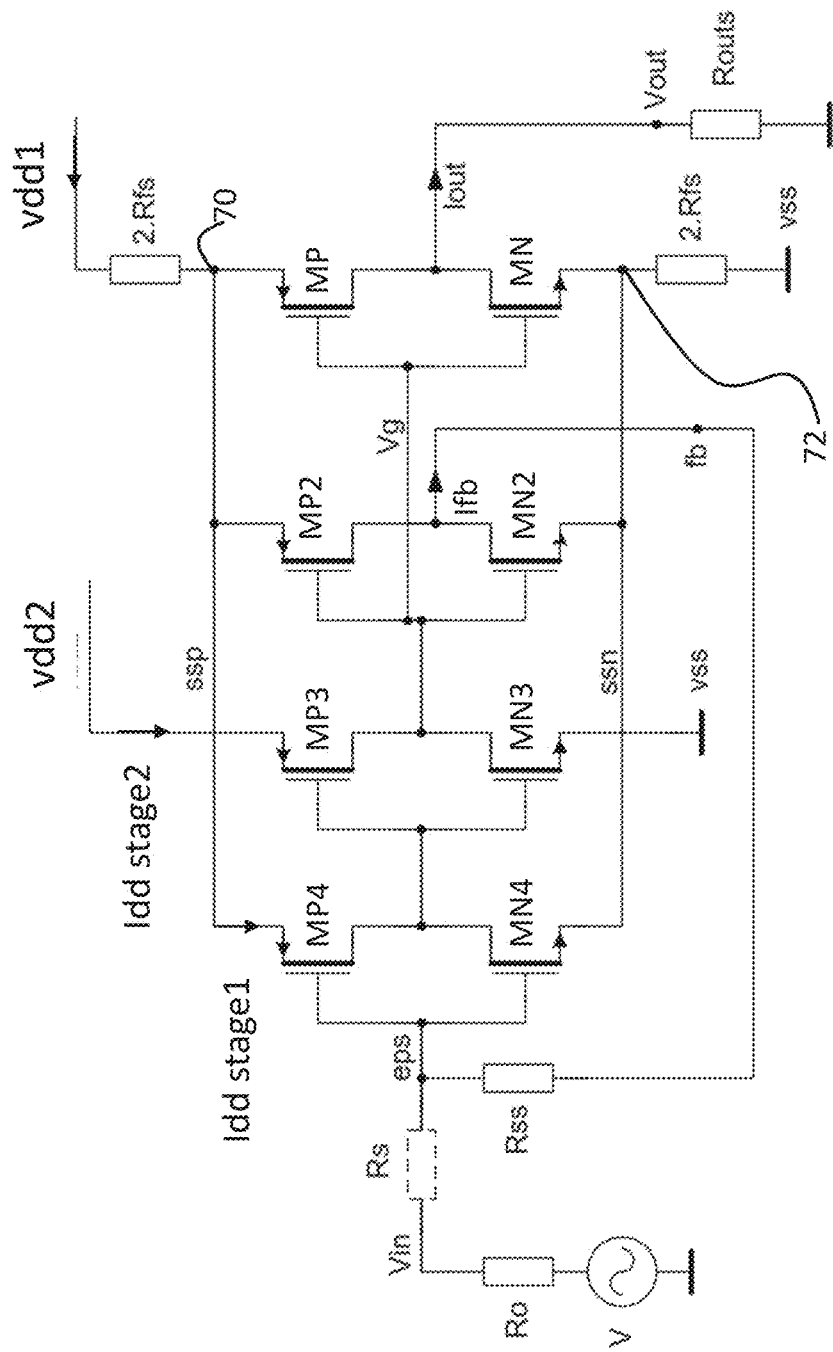
FIG. 7 shows another example of circuit in accordance with the invention.

In FIG. 7 the transistors MP4,MN4 are the same as MP4, MN4 in FIG. 6. The inverter MP3,MN3 performs the function of the opamp inverters ivp, ivn in the circuit of FIG. 6.

The circuit of FIG. 7 comprises the main output stage MP, MN; the scaled replica output stage MP2,MN2 and the series feedback resistors 2×Rfs.

The circuit of FIG. 7 operates in the manner explained above in connection with FIG. 4, and provides an implementation of the circuit of FIG. 4 with low component count. The circuit can be implemented using CMOS technology, and indeed the amplifier input stage MP4,MN4 effectively comprises two inverter stages to provide the current source and inverter functions of FIG. 6, as well as two inverter stages for the output and output replica amplifier stages. Each inverter stage is implemented by a PMOS and NMOS transistor with common gate drive signals.

The second stage of the input MP3,MN3 is preferably supplied by a second supply voltage vdd2, drawing a current Idd stage 2. This prevents the signal currents from the pair MP3 and MN3 from contributing to the voltage to current transfer function of the amplifier. Ideally only the output current denoted "Iout" should flow through resistors 2Rfs.

$$Iout = \frac{ssp}{2 \cdot Rfs} + \frac{ssn}{2 \cdot Rfs} \approx \frac{Vin}{Rfs}$$

However, for less demanding applications the additional supply voltage vdd2 of the stage MP3,MN3 could be removed and source terminals of MN3 and MP3 could be connected to signal nodes 72 and 70 respectively. Optionally, forward body bias can be applied to one or more transistors in the circuit FIG. 7 to lower the transistor threshold voltage and enhance operation at a lower drain-source DC bias voltage that results from the DC drop across feedback resistors 2 Rfs.

Figure 8:
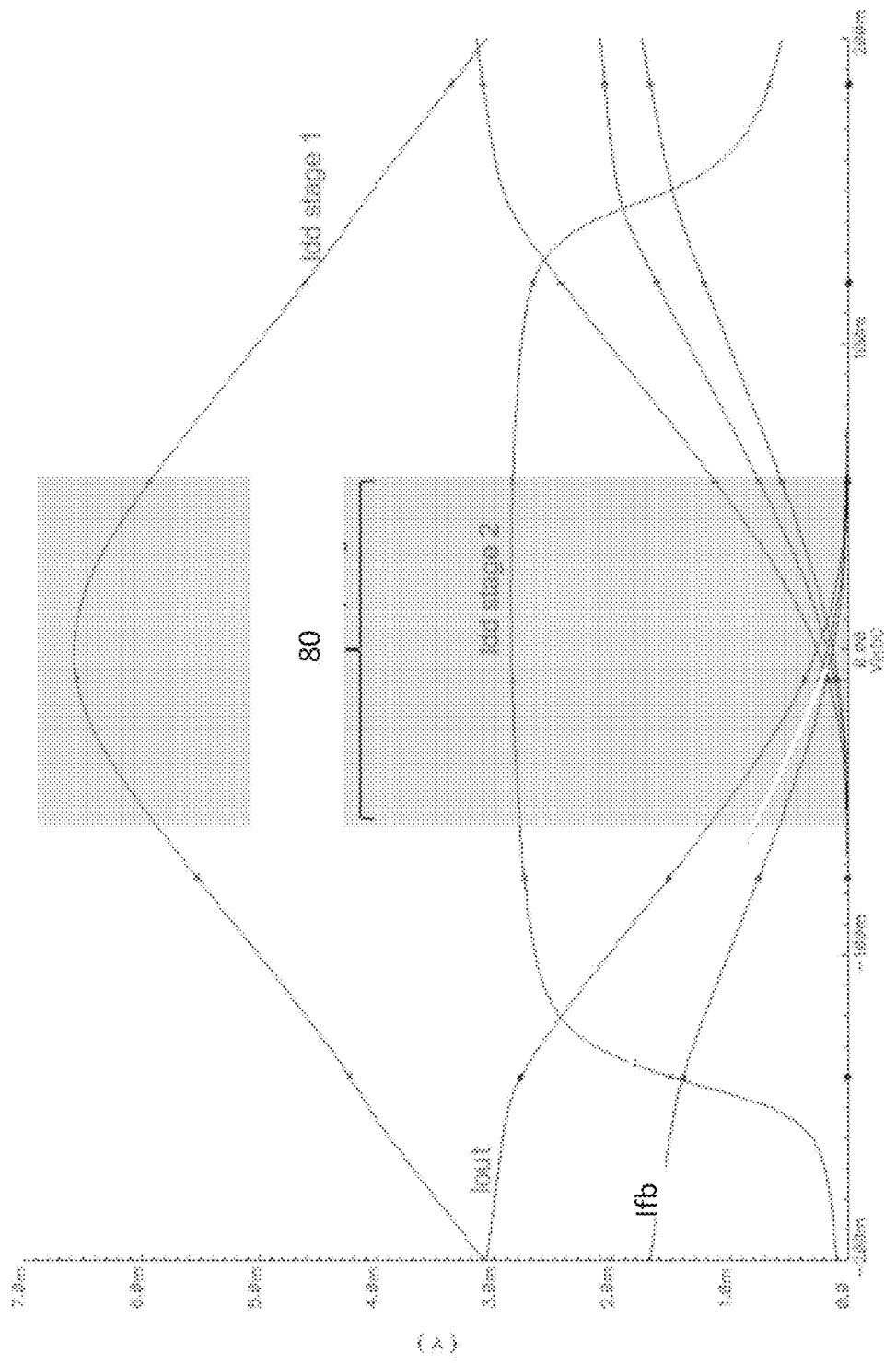
FIG. 8 is a first graph to show characteristics of the circuit of FIG. 7.

FIG. 8 shows a DC simulation which illustrates the operation of the LNTA.

The horizontal axis is the input signal VinDC applied with reference to the nominal input operating point. The vertical axis shows DC currents flowing through first and second amplifier stages (from node ssp to node ssn, refer FIG. 7) and individual currents through PMOS and NMOS transistors in output ("Iout") and replica feedback ("Ifb"). From the graph it can be recognized that the output stage of the LNTA operates in class AB. The quiescent current is low compared to the maximum signal current that can be delivered. The region 80 shows the allowable input swing of 56 mVp (millivolt peak) producing a near-to-undistorted output signal. The currents "Idd stage 1" and "Idd stage 2" are illustrated in FIG. 7, and they are the PMOS/NMOS drain currents drawn from the supply.

Since feedback for input termination is obtained with a replica pair the noise generated in transistor pairs MP2,MN2 and MP,MN respectively is uncorrelated.

It is therefore important to minimize noise contributed by the replica stage. The replica stage noise generated is mostly DC current related and therefore the DC current should be low.

To minimize distortion it is important that replica stage MP2,MN2 operates under the same conditions as output stage MP,MN (same voltages and current densities). Therefore, the magnitude and phase of the voltages at nodes Vout and fb should be the same as much as possible. Assuming a resistive load Routs the output voltage Vout is the amplified inverse of the input voltage Vin except for some delay between input and output.

Figure 9:
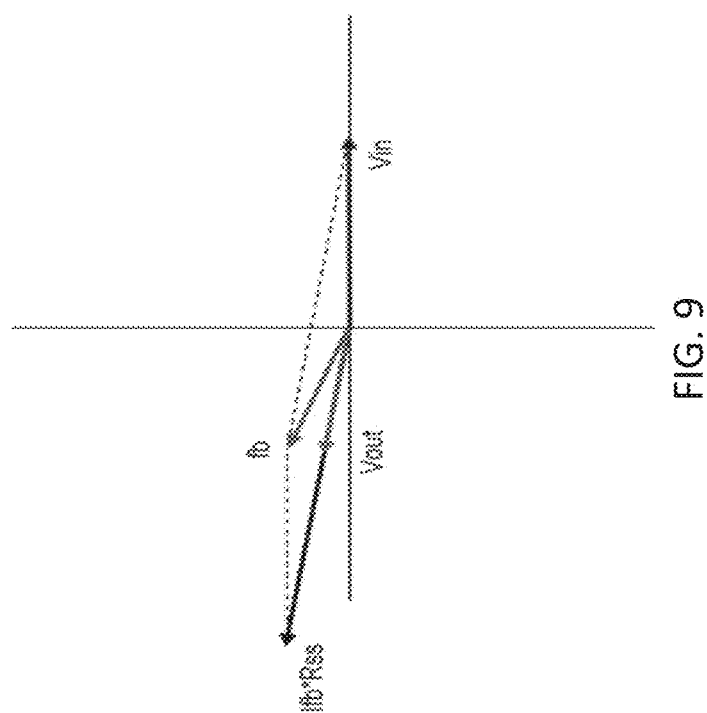
FIG. 9 is a second graph to show a characteristic of the circuit of FIG. 7.

FIG. 9 shows a vector diagram of the LNTA input/output voltages and currents. It illustrates how the node voltage Vout can be approximated by adding Ifb*Rss to Vin. Identity between fb and Vout is needed to create identical operating conditions for transistors in the output stage and replica stage so as to minimize distortion. A suitable choice of Rss results in the condition that voltage at node fb is closely resembling the voltage at node Vout.

Figure 10:
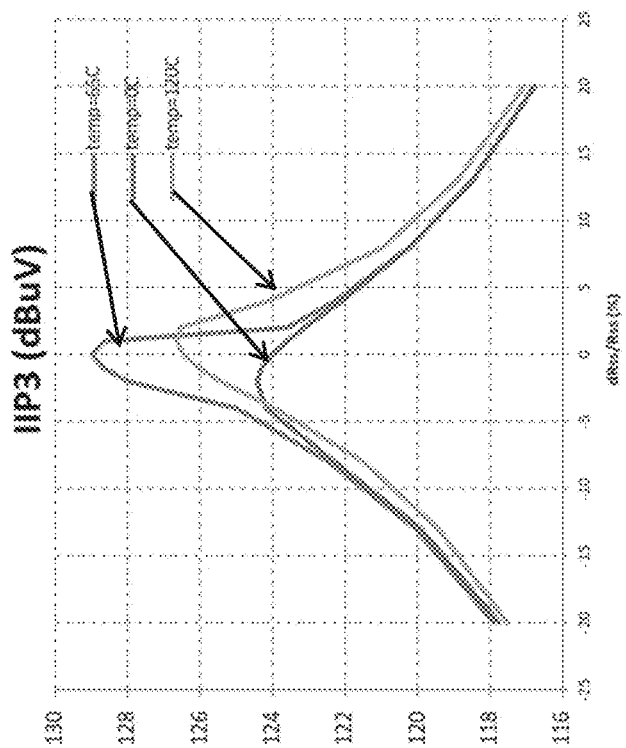
FIG. 10 is a third graph to show a characteristic of the circuit of FIG. 7.

FIG. 10 shows the input referred third-order intermodulation intercept point as function of the Rss value for a typical implementation of LNTA according to FIG. 7 in pseudo differential operating mode, from a 200Ω source (this is shown as the resistance Ro). The result translates to an input referred IP3 of +13 dBm in 50Ω.

FIG. 10 illustrates that for a typical implementation, if the equality condition is not fulfilled, the distortion increases. Mismatch analysis results of the LNTA driving a mixer stage for an application as FM receiver shows that a robust LNTA can nevertheless in general be realized with a fixed value for Rss and that there is no need to tune the value of Rss in dependence on variations in process, temperature or supply.

Figure 11:
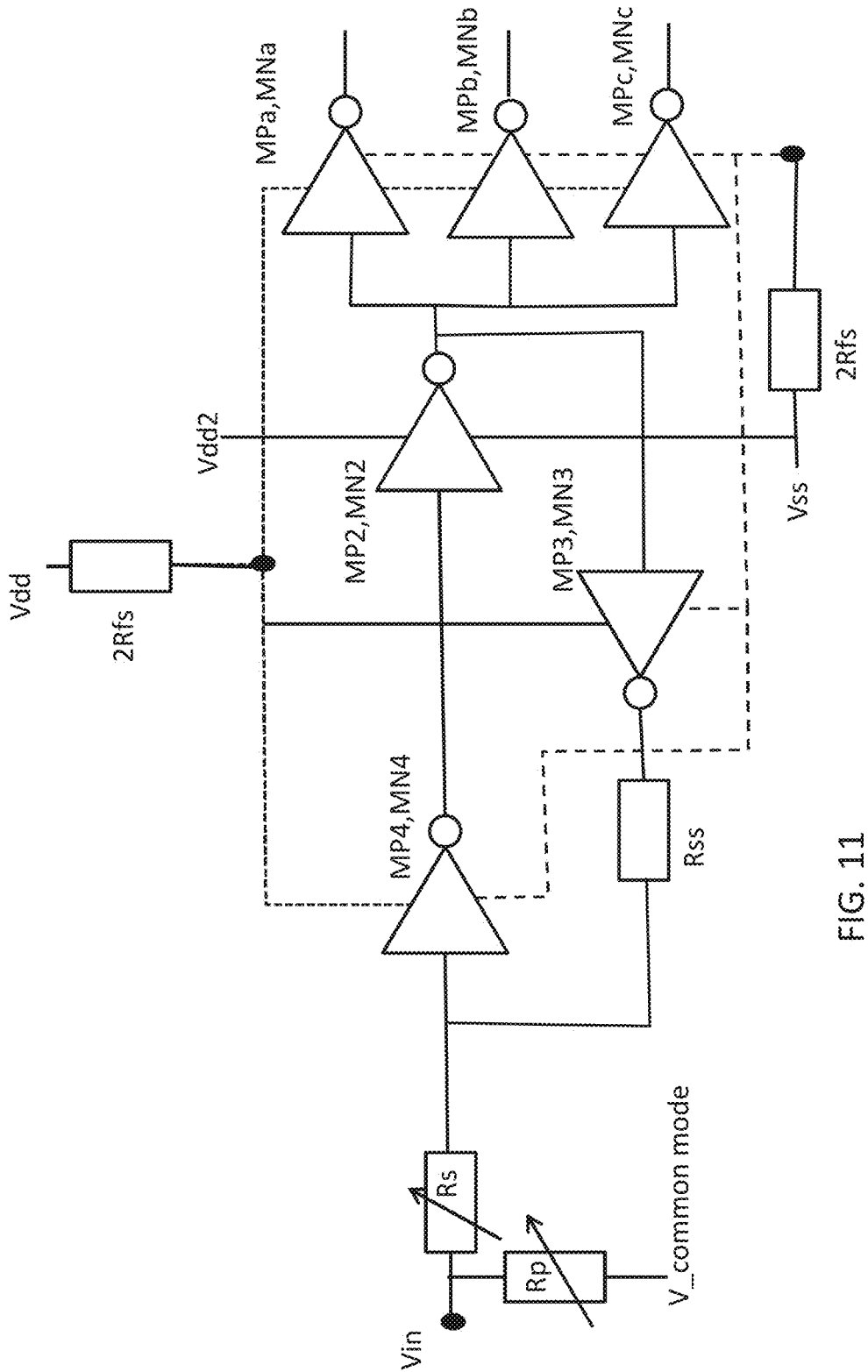
FIG. 11 shows a further example of circuit in accordance with the invention.

FIG. 11 shows the circuit of FIG. 7 with the NMOS/PMOS transistor pairs drawn as inverters. An input attenuator (Rs, Rp) can be provided at the input shown as the two variable resistors. The circuit shown has three weighted outputs, for example for driving a passive harmonic reject mixer. The three outputs are implemented as separate output inverter stages, labelled as a, b and c in FIG. 11. The circuit as shown can for example represent one half of a pseudo-differential amplifier stage.

When the LNTA output drives a passive mixer, a good and consistent IP3 performance is obtained when Rss is comprised of a series circuit of NMOS transistors (the equivalent of the mixer switch) and a resistor (the input impedance of TIA). To maximize the IP3 performance an adaptive adjustment of the Rss value can be implemented using a quality analysis of the signal received.

The achieved +13 dBm IIP3 at Psup≈30 mW for the LNTA is significantly better than performance previously reported, for a comparable Noise Figure and power dissipation.

As shown in FIG. 11, the circuit is easily extendable towards multiple (weighted) output currents, by providing multiple output stages.

The invention is of particular interest for CMOS applications in need of a low noise transconductance amplifier, for example for driving a frequency conversion stage employing a passive mixer requiring high linearity and low noise. Applications include multi-band multi-mode multi-standard radio receivers, software-defined radio (SDR), radio receivers for broadcast and cellular standards.

The invention has been described based on a preferred implementation in CMOS, using NMOS and PMOS inverter stages. However, other implementations of the amplifier stages are also possible, and the invention resides in the feedback of a scaled replica of the output current to the input to provide input termination and linearity enhancement.

Various modifications will be apparent to those skilled in the art.

The invention claimed is:

1. A transconductance amplifier, comprising:
An input amplifier stage;
an output amplifier stage; and
a replica output stage which generates a feedback current which is a scaled replica of the output current of the amplifier, wherein the feedback current is provided to the amplifier input; and wherein the input amplifier stage comprises a first inverter and a second inverter in series, the second inverter providing a drive signal, and the amplifier output stage and replica output stage are driven in parallel each by the drive signal.

2. An amplifier as claimed in claim 1, wherein the feedback current is provided to the amplifier input through a feedback impedance.

3. An amplifier as claimed in claim 1, comprising a variable resistor between an input to the amplifier and the input to the input inverter stage.

4. A frequency down converter comprising:
an amplifier as claimed in claim 1;
a frequency conversion stage supplied with current by the amplifier; and
a transimpedance amplifier connected to the output of the frequency conversion stage.

5. A transconductance amplifier, comprising:
An input amplifier stage;
an output amplifier stage; and
a replica output stage which generates a feedback current which is a sealed replica of the output current of the amplifier, wherein the feedback current is provided to the amplifier input and further including a first resistor between a first power rail and a first internal signal node, and a second resistor between a second power rail and a second internal signal node.

6. An amplifier as claimed in claim 5, wherein the input stage, the output stage and the replica output stage are jointly connected to the internal respective signal nodes.

7. An amplifier as claimed in claim 5, wherein the feedback current is provided to the amplifier input through a feedback impedance.

8. An amplifier as claimed in claim 5, comprising a variable resistor between an input to the amplifier and the input to the input inverter stage.

9. A frequency down converter comprising:
an amplifier as claimed in claim 5;
a frequency conversion stage supplied with current by the amplifier; and
a transimpedance amplifier connected to the output of the frequency conversion stage.

10. A transconductance amplifier, comprising
An input amplifier stage;
an output amplifier stage; and
a replica output stage which generates a feedback current which is a scaled replica of the outset current of the amplifier, wherein the feedback current is provided to the amplifier input; and wherein the output stage comprises a plurality of sections in parallel, providing a set of weighted outputs.

11. An amplifier as claimed in claim 10, wherein the feedback current is provided to the amplifier input through a feedback impedance.

12. An amplifier as claimed in claim 10, comprising a variable resistor between an input to the amplifier and the input to the input inverter stage.

13. A frequency down converter comprising:
an amplifier as claimed in claim 10;
a frequency conversion stage supplied with current by the amplifier; and
a transimpedance amplifier connected to the output of the frequency conversion stage.

* * * * *